United States Patent [19]

Powers

[11] Patent Number: 4,951,089
[45] Date of Patent: Aug. 21, 1990

[54] PHOTOGRAPHIC PRINTING APPARATUS

[75] Inventor: John W. Powers, Battlefield, Mo.

[73] Assignee: Western Litho Plate and Supply Company, St. Louis, Mo.

[21] Appl. No.: 364,247

[22] Filed: Jun. 9, 1989

[51] Int. Cl.$^5$ .......................................... G03B 27/04
[52] U.S. Cl. ........................................ 355/85; 355/99
[58] Field of Search .................. 355/85, 99, 79, 86, 355/102, 103

[56] References Cited

U.S. PATENT DOCUMENTS

| | | | |
|---|---|---|---|
| 3,635,559 | 1/1972 | Harrell et al. | 355/85 |
| 3,810,694 | 5/1974 | Harrell et al. | 355/18 |
| 4,353,647 | 10/1982 | Harrell et al. | 355/85 |
| 4,423,955 | 1/1984 | Powers | 355/99 |
| 4,565,443 | 1/1986 | Yazaki | 355/99 |
| 4,575,233 | 3/1986 | Copeland et al. | 355/85 |
| 4,575,235 | 3/1986 | Powers | 355/99 X |
| 4,583,838 | 4/1986 | Michida et al. | 355/85 X |
| 4,614,425 | 9/1986 | Copeland et al. | 355/99 |
| 4,664,510 | 5/1987 | Weag | 355/99 X |

Primary Examiner—Richard A. Wintercorn
Attorney, Agent, or Firm—Senniger, Powers, Leavitt and Roedel

[57] ABSTRACT

Apparatus for selectively exposing photosensitized plates to light through films operable selectively in a first mode for exposing plates of single newspaper page size to light through films of such size, and in a second mode for exposing plates of double newspaper page size to light through films of such size, utilizing a first window frame with two single-page size windows therein in the first mode and a second window frame with a double-page size window therein in the second mode.

17 Claims, 11 Drawing Sheets

PHOTOGRAPHIC PRINTING APPARATUS

BRIEF SUMMARY OF THE INVENTION

This invention relates to photographic printing apparatus, and more particularly to apparatus for automatically carrying photosensitive plates, and especially lithographic plates, through exposure operations.

The invention involves an improvement on the photographic printing apparatus shown in my U.S. Pat. No. 4,423,955, issued Jan. 3, 1984, entitled Photographic Printing Apparatus, designated as an improvement on the Photographic Printing Apparatus shown in the U.S. Pat. No. of Robert E. Harrell et al. 4,353,647 issued Oct. 12, 1982, which in turn is an improvement on the Photographic Printing Apparatus shown in the U.S. Pat. No. of Robert E. Harrell et al. 3,810,694, issued May 14, 1974, which in turn is an improvement on the Photographic Printing Apparatus shown in the U.S. Pat. No. of Robert E. Harrell et al. 3,635,559, issued Jan. 18, 1972. All these patents, and particularly U.S. Pat. No. 4,423,955, are incorporated herein by reference.

Among the several objects of this invention may be noted the provision of an improved photographic printing apparatus of the type shown in my aforesaid U.S. Pat. No., 4,423,955, particularly for high speed color plate-making (plate exposing) with accurate registration; and the provision of such apparatus adapted for processing two single-page plates simultaneously or a double-page plate, and for being relatively quickly and readily converted from one of these modes to the other.

In general, apparatus of this invention for exposing photosensitized plates to light through films is operable selectively in a first mode for exposing single-page plates to light through single-page films and in a second mode for exposing double-page plates to light through double-page films. It comprises means for selectively holding side-by-side two stacks of single-page plates and two stacks of films and one stack of double-page plates and one stack of double-page films with each stack of films above and offset in a rearward direction from a respective stack of plates so that each stack of plates extends forward from under the respective stack of films, and has an exposure station at which a single-page plate from each of two single-page plate stacks may be simultaneously exposed to light through a single-page film from each of two single-page film stacks, or a double-page plate from a double-page stack may be exposed to light through a double-page film from a double-page film stack, with the said exposure station being located forward of the stack-holding means. Means is provided for selectively delivering a single-page plate from each of said single-page plate stacks and a single-page film from each of said single-page film stacks to exposure position at the exposure station and delivering a double-page plate from the double-page plate stack and a double-page film from the double-page film stack to exposure position at the exposure station. Means is provided at the exposure station for supporting, side-by-side, two single-page plates with single-page films thereon, or a double-page plate with a double-page film thereon. A carriage is movable downwardly from a raised retracted position above said supporting means to a lowered position, said carriage having means for selectively holding a double-pane window frame having two single-page size windowpanes for operation of the apparatus in the first mode and a single-pane window frame having a single double-page size windowpane for operation of the apparatus in the second mode.

Other objects and features will be in part apparent and in part pointed out hereinafter.

BRIEF DESCRIPTION OF THE DRAWINGS

Corresponding reference characters indicate corresponding parts throughout several views of the drawings.

DETAILED DESCRIPTION

The present invention involves improvements upon the apparatus shown in my aforesaid U.S. Pat. No. 4,423,955 for exposing photosensitized lithographic plates individually designated P, i.e. aluminum plates having a light-sensitive coating on one surface thereof such as are widely used in newspaper printing, to light through films individually designated F, e.g., photographic negatives of newspaper pages to be printed. It will be understood however that, broadly considered, the invention may be embodied in apparatus for exposing other photosensitized plates, and apparatus in which films which are positives may be used instead of negatives. Apparatus of the present invention corresponds to the apparatus described in said U.S. Pat. No. 4,423,955 in having two side-by-side exposure lines for simultaneously exposing two single-page plates P to light through two single-page films F (negatives), "single-page" referring to single newspaper pages (generally measuring about 23½"×13½"), one of these exposure lines indicated at 1L in FIG. 2 of said patent and in FIG. 1 herein being referred to as the left-hand exposure line, the other indicated at 1R being referred to as the right-hand exposure line. "Left" and "right" are in reference to viewing the apparatus from its infeed end, looking toward its outfeed end, the direction from the infeed end to the outfeed end being referred to as "forward".

Figure 8:
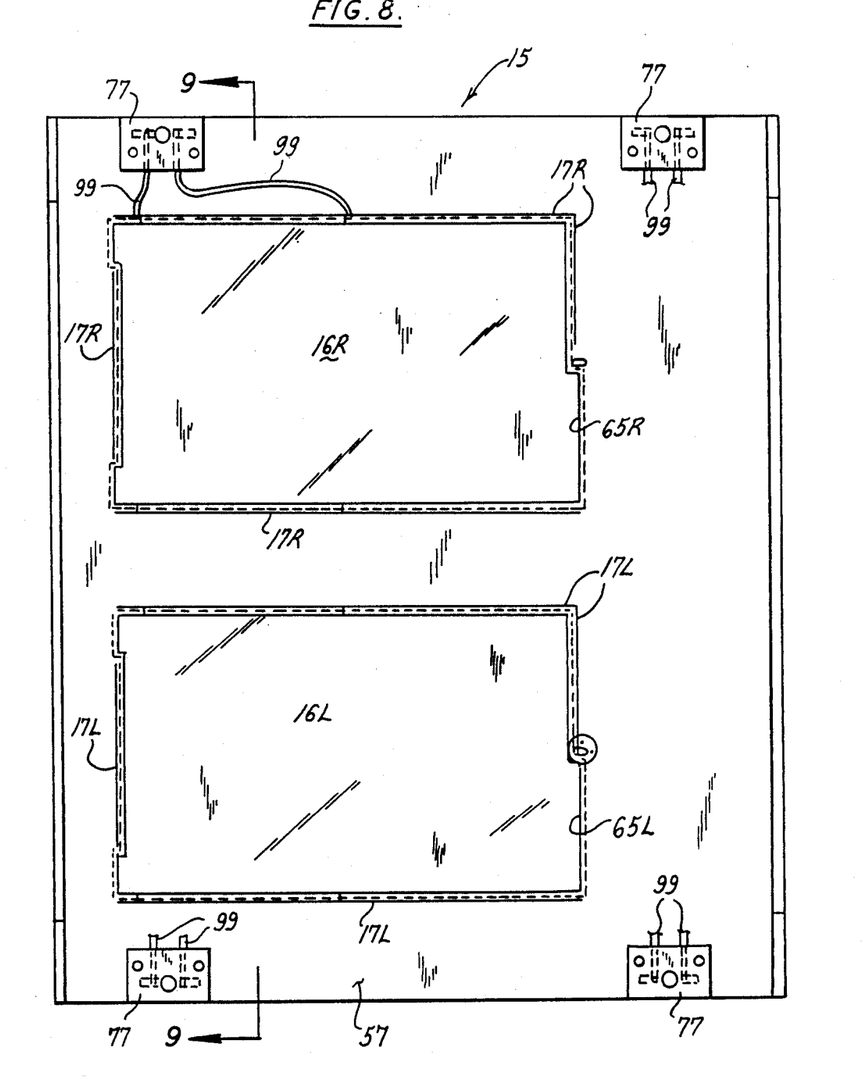
FIG. 8 is a plan of a window frame of this invention with two windowpanes for single-page plate processing.
Figure 9:
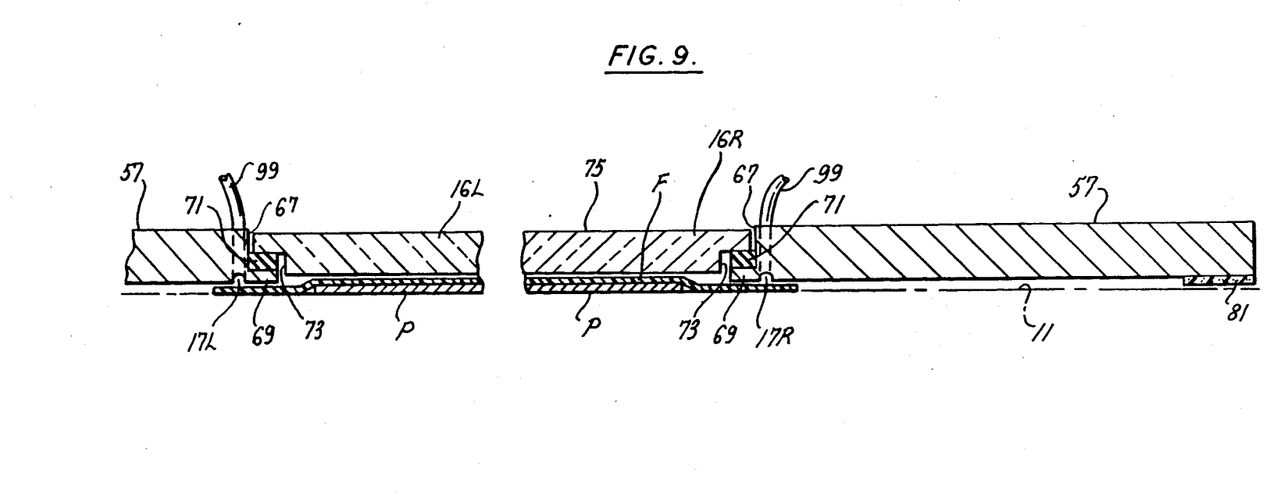
FIG. 9 is a vertical section taken on line 9—9 of FIG. 8 on a larger scale than FIG. 8 (and also a section taken on line 9—9 of FIG. 12)

Like the prior apparatus of said U.S. Pat. No. 4,423,955, the present apparatus has a first carriage 3 (see FIGS. 3 and 4), which may be referred to as the infeed or delivery carriage, having vacuum gripper means for picking up a plate P and a film F from each of a left-hand stack of plates at 5L, a right-hand stack of plates at 5R, a left-hand stack of films at 7L and a right-hand stack of films at 7R at the infeed end of the respective exposure lines 1L and 1R, the carriage being movable forward to carry the picked-up plates and films to an exposure station 9 and deposit them in registration on a platen 11 in exposure positions at the exposure station for exposure of the plates to light through the films, and through an exposure window means 15 (FIGS. 6, 7 and 8) which is movable up and down at the exposure station for engagement of its lower face with the films on the plates at the exposure station. For operation in the single-page mode the window means has left- and right-hand single-page size windowpanes, 16L and 16R, and left- and right-hand sets of vacuum grooves 17L and 17R in its lower face associated with these windowpanes (see FIGS. 8 and 9) for vacuum gripping films to the lower face (bottom) of the window means for raising the films along with the window means away from the plates. A second carriage, not shown, but which is essentially the same as the carriage designated 19 in said U.S. Pat. No. 4,423,955, and which may be referred to as the outfeed or discharge or takeaway carriage, has vacuum gripper means for gripping plates which have been exposed at the exposure station and for gripping films raised with the window means, and is movable forward after having gripped the plates and films to carry the exposed plates away from the platen 11 and the films away from the window means and out of the exposure station. Each film may be retained on the bottom of the window means at the exposure station, the respective exposed plate discharged, and an additional plate or plates delivered from the respective plate stack for exposure to light through the retained film, the retained film then being discharged concurrently with the discharge of the last plate exposed therethrough. When only one Plate is to be exposed through a film, the film is not retained for any additional exposure, but is discharged concurrently with the discharge of the one exposed plate.

Figure 2:
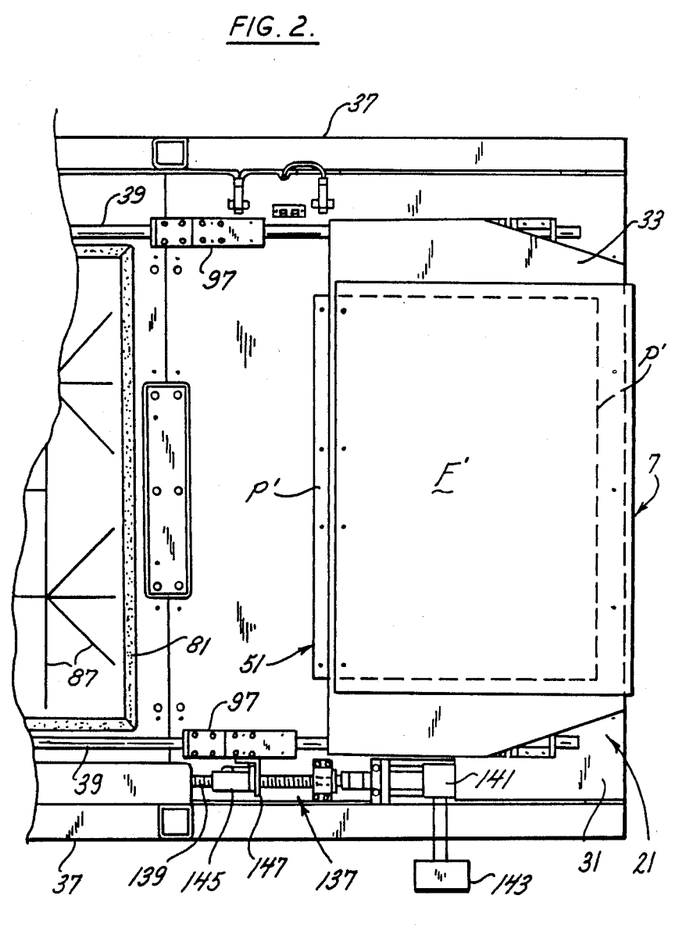
FIG. 2 is a fragment of FIG. 1 illustrating the processing of double-page plates.

As will appear, the carriage 3 is also adapted to pick up a double-page plate P' and a double-page film F' from respective stacks 5' and 7' thereof (see FIG. 2) and carry them to the exposure station 9 for exposure of the double-page plate to light through the double-page film. For operation in the double-page mode, a double-page window means is used having a single double-page size windowpane as will appear.

As in the apparatus shown in my said prior patent, the present apparatus comprises means indicated generally at 21 at what may be called the stack-holding station for holding the left-hand stack 5L and the righthand stack 5R of plates to be exposed, and the left-hand stack 7L and the right-hand stack 7R of films through which the plates are to be exposed. The left-hand stack 7L of films is held above and offset in what is termed rearward direction (which is the direction toward the right as viewed in FIG. 1) from the left-hand stack 5L of plates and, similarly, the right-hand stack 7R of films is held above and offset in said rearward direction from the right-hand stack 5R of plates. The plates P are rectangular. Each plate has a pair of registration holes adjacent one edge (one of the narrow edges of the plate) constituting what may be referred to as its forward or leading edge. The films F are also rectangular, each having a pair of registration holes corresponding to the holes in the plates at its forward or leading edge. The left-hand set of stacks 5L and 7L and the right-hand set of stacks 5R and 7R are held side-by-side at the stack-holding station at 21, with the left-hand set at the infeed or entry end (the upstream end) of the left-hand exposure line 1L and the right-hand set at the infeed or entry end (the upstream end) of the right-hand exposure line 1R. As to each set, the plate stack and the film stack in the set are held in transverse register but with the stated longitudinal rearward offset of the film stack from the plate stack, the plate stack extending forward from under the film stack.

Reference may be made to U.S. Pat. No. 4,423,955 for details. For exposure of double-page plates through double-page films, a stack 5' of double-page plates P' is placed at the stack-holding station, and a stack 7' of double-page films F' is placed above and offset in rearward direction from the stack of double-page plates, the plates and films having appropriate registration holes.

The means 21 for holding the stacks at the stack-holding station comprises a table 31 for holding the two single-page plate stacks 5L and 5R or a single double-page plate stack, and a sliding holder or tray 33 for holding the two single-page film stacks 7L and 7R or a single double-page film stack 7' above and offset rearward from the plate stacks. The table 31 comprises a top plate mounted in horizontal position on the frame of the apparatus, the table being at a convenient height for placement of the plate stacks or stack on the table by an operator standing at the rearward end of the apparatus. The exposure platen 11, constituted by a flat rectangular metal plate (e.g., aluminum) is mounted on the frame forward of the table with its upper surface generally flush with the upper surface of the table. The platen 11 is somewhat narrower than the table 31. The frame carries narrow elongate plates 37 along both sides of the table and the platen, the upper surfaces of these side plates being flush with the upper surface of the platen. Guide rails 39 extend longitudinally of the apparatus adjacent the left and right sides of the apparatus on the table and the side plates 37, these rails extending forward well beyond the forward edge of platen 11.

The single-page plates P in the single-page plate stacks 5L,R and the single-page films F in the single-page film stacks 7L,R are registered on registration pins extending up through the registration holes in these plates and films in essentially the same manner as described in said U.S. Pat. No. 4,423,955. In the double-page mode of operation, the double-page plates in the double-page plate stack and the double-page films in the double-page film stack are similarly registered on pins extending up through the registration holes in these plates and films.

At the exposure station 9, forward of (downstream from) the stack-holding means or station 21, the exposure window means 15 is movable downwardly toward and upwardly away from the platen 11. The window means 15 of the present invention comprises an elevator structure or carriage generally designated 41 comprising an open rectangular frame having members 43 (forward and rearward members) extending transversely of the apparatus and side members 45 extending longitudinally of the apparatus bounding a rectangular opening 47. The frame 41 has brackets 49 at its four corners carrying guide bushings 51 (corresponding to guide bushings 59 of 4,423,955) slidable on vertical rails 53 extending up from the base of the apparatus at the four corners of the platen 11. The carriage frame is movable up and down on these rails by means of rodless cylinders 55 (see FIG. 7).

Figure 12:
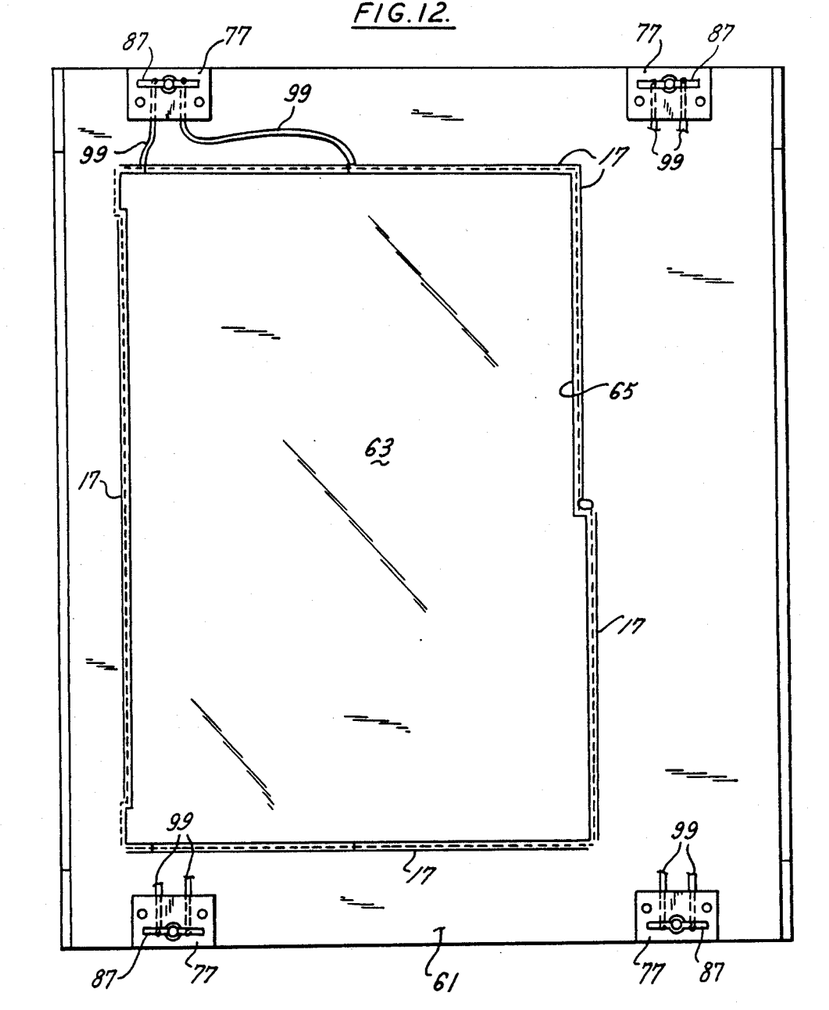
FIG. 12 is a view similar to FIG. 8 showing a window frame of this invention with a single windowpane for double-page plate processing.

The window means 15 is adapted selectively to hold either a double windowpane frame 57 (see FIGS. 6 and 8) having the two single-page size windowpanes 16L and 16R for operation of the apparatus in the single-page mode, and/or a single windowpane frame 61 (see FIG. 12) having a single double-page size windowpane 63 for operation of the apparatus in the double-page mode. The double windowpane frame 57 comprises a relatively thick rectangular plate (an aluminum plate, for example) having two side-by-side generally rectangular single-page size window openings therein designated 65L and 65R, respectively, 65L being at the left and 65R at the right. The plate 57 is provided with an upwardly opening recess 67 all around the periphery of each opening 65L, 65R forming a relatively thin lip 69 or flange extending all around each opening at the bottom of the plate, the bottom of each lip being flush with the bottom of the plate. The lip carries on its upper face a resiliently compressible seal 71, which may be suitably adhered to the lip. The upper face of the seal is well below the upper face of the plate 57. Each of the windowpanes 16L and 16R is provided with a downwardly opening recess 73 all around its periphery forming an outwardly projecting lip or flange 75 all around its periphery. This lip or flange 75 on each windowpane fits relatively loosely in the recess 67 around the respective opening 65L, 65R, bearing down on the respective seal 71. The dimensions of the components are such that, with each windowpane bearing on the respective seal, and the latter generally in its uncompressed state, the bottom face of the windowpane is slightly (e.g., approximately 0.010 inch) above the bottom face of the plate 57 for a purpose that will appear.

Figure 10:
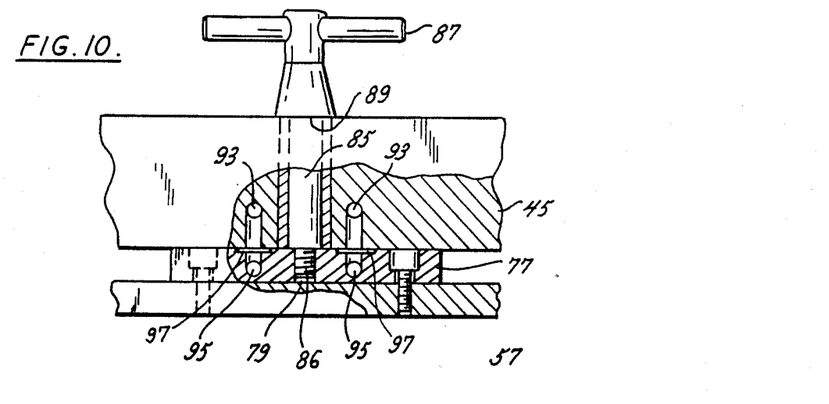
FIG. 10 is a view generally on line 10—10 of FIG. 6 with parts broken away and shown in section.
Figure 11:
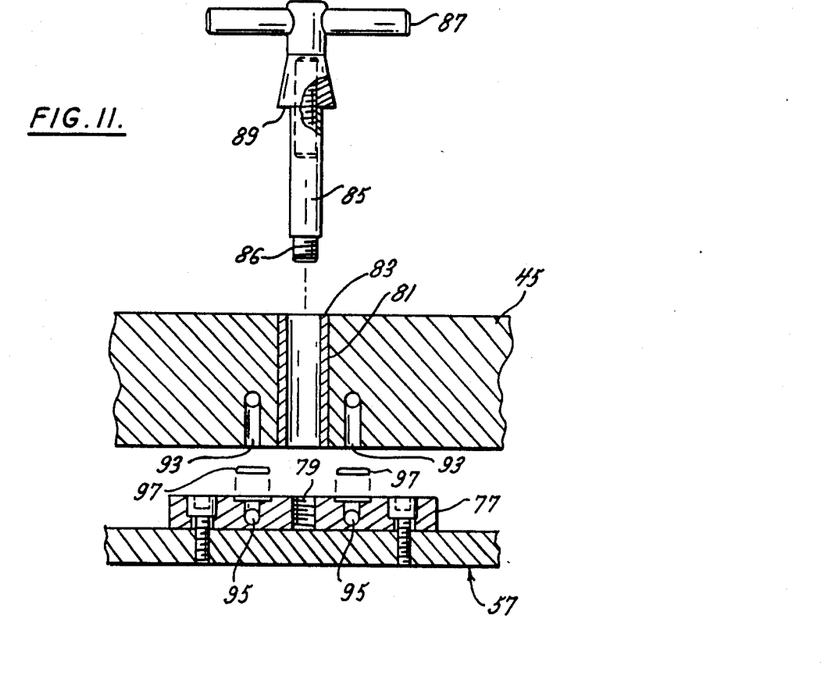
FIG. 11 is a view similar to FIG. 10 showing parts disassembled.

Means for the releasable securement to the bottom of the window holder means 15 of the window frame or plate 57 (with the two windowpanes 16L and 16R) is shown to comprise a set of blocks, each designated 77, one adjacent each of the four corners of the plate secured on the top of the plate. Each block may also be identified as a locating pin base. Each has a threaded opening 79 extending vertically therein. Each of the side members 45 of the window holder frame 41 has an opening 81 extending vertically therethrough adjacent each end thereof with a bushing 83 in the opening. A locating pin 85 is rotatable and vertically slidable in the bushing. The pin has a reduced-diameter threaded lower end 86 adapted to be threaded into and out of the threaded opening 79 in a respective block 77, and a T-handle 87 at its upper end having an annular shoulder at 89 engageable with the top of the member 45. For supplying vacuum to the vacuum grooves 17L, 17R in the bottom of the plate 57, vacuum lines such as indicated at 91 are connected to passages 93 in the frame side members 43. These passages communicate with passages 95 in the respective blocks when the plate 57 is secured by the pins 85 to the bottom of members 45 as shown in FIG. 10, 0-rings 97 being provided between the bottom of members 45 and the top of the blocks to seal the connection. Vacuum lines such as indicated at 99 (omitted in FIG. 6 and shown partially in FIGS. 8, 9 and 12) interconnect the passages 95 and the vacuum grooves. The single windowpane frame 61 having the double-page size windowpane 63 is made essentially the same as the double windowpane frame 57 as above described, except for the window opening therein, designated 65, being of double-page size. The set of vacuum grooves in the bottom of window frame 61 (corresponding to vacuum grooves 17L and 17R) is indicated at 17. It is mounted on the bottom of frame 41 in the same manner as the double windowpane frame 57.

Figure 1:
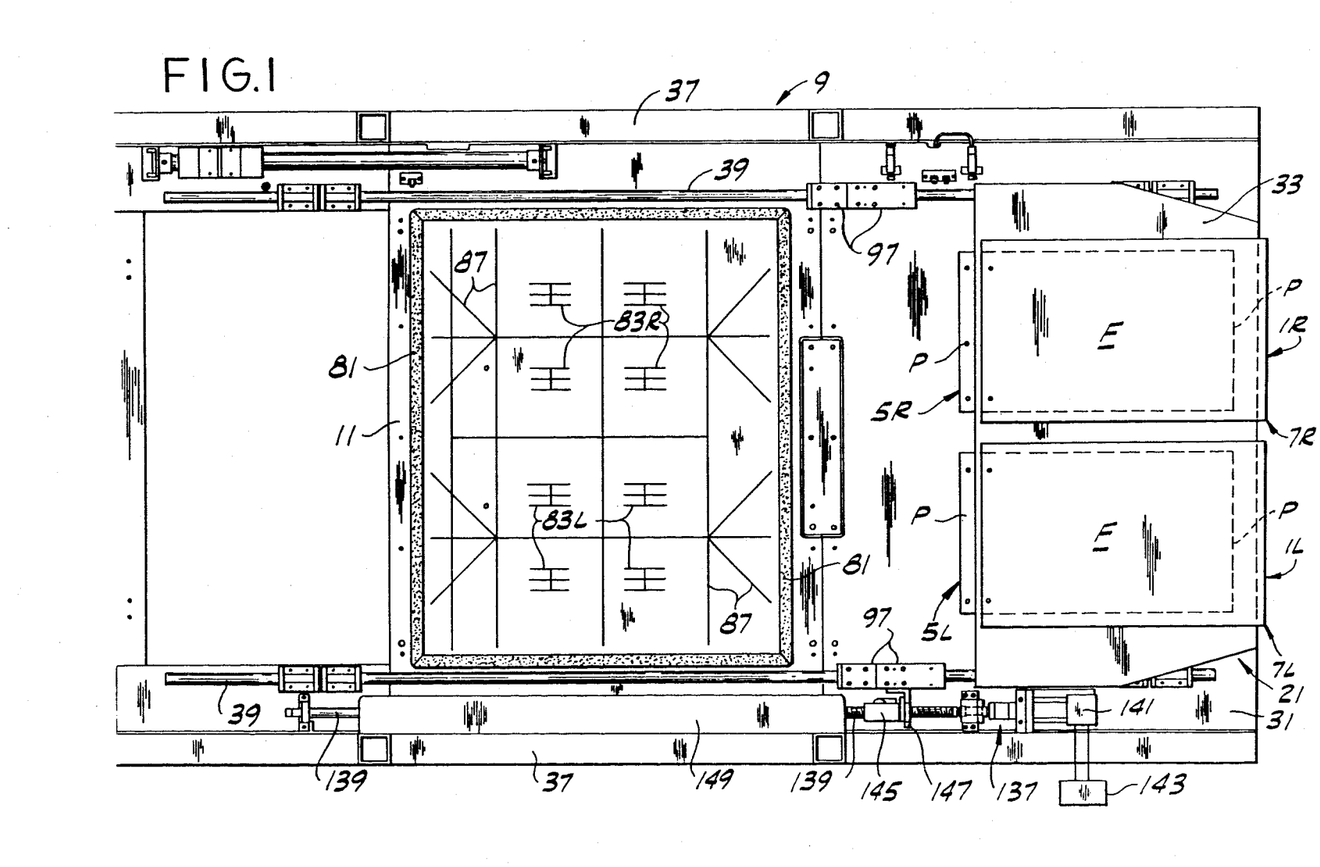
FIG. 1 is a view similar to FIG. 2 of said U.S. Pat. No. 4,423,955 showing the new apparatus, and illustrating the processing of single-page plates.

The platen 13 corresponds essentially to that shown in the aforesaid U.S. Pat. No. 4,423,955 and reference may be made thereto for details. In FIG. 1 there are shown the sets of vacuum grooves 83L, 83R generally the same as shown in said patent for vacuum gripping plates down on the platen and the set of vacuum grooves 87 also generally the same as shown in said patent, the vacuum drawn in these grooves 87 being functional in the present invention to cause the windowpanes 16L,R to be forced down by ambient air pressure into pressurized engagement with the films and plates at the exposure station in the case of operation in the single-page mode, and the windowpane 63 to be forced down into pressurized engagement with single film and plate at the exposure station in the case of operation in the double-page mode. Also shown is the sealing strip 81 on the platen 11 which is engageable by the window frame plate 57 when it is moved down.

As in the apparatus shown in said U.S. Pat. No. 4,423,955, carriage 3 and the vacuum gripper means carried thereby constitutes means for delivering a single-page plate P from each of the single-page plate stacks 5L, 5R and a single-page film F from each of the single-page film stacks 7L, 7R to the respective exposure position 13L, 13R at the exposure station 9. The carriage 3 is movable forward from a retracted plate and film pickup position over the stacks to the exposure station 9, and rearward back to retracted position. It comprises an elongate bridge member 95 mounted at its ends on supports 97 on guide bushings 99 slidable on the left and right side rails 39, the bridge member 95 extending transversely of the apparatus at an elevation above the tray 33. Vacuum gripper means 101L is movable up and down on the carriage at the left for gripping the top plate P of the left-hand plate stack 5L and delivering it to position 13L at the exposure station, and similar vacuum gripper means 101R is movable up and down on the carriage at the right for gripping the top plate P of the right-hand plate stack 5R and delivering it to position 13R at the exposure station. Vacuum gripper means 103L is movable up and down on the carriage at the left for gripping the top film F of the left-hand film stack 7L and delivering it to position 13L at the exposure station, and similar vacuum gripper means 103R is movable up and down on the carriage at the right for gripping the top film F of the right-hand film stack 7R and delivering it to position 13R at the exposure station.

Figure 3:
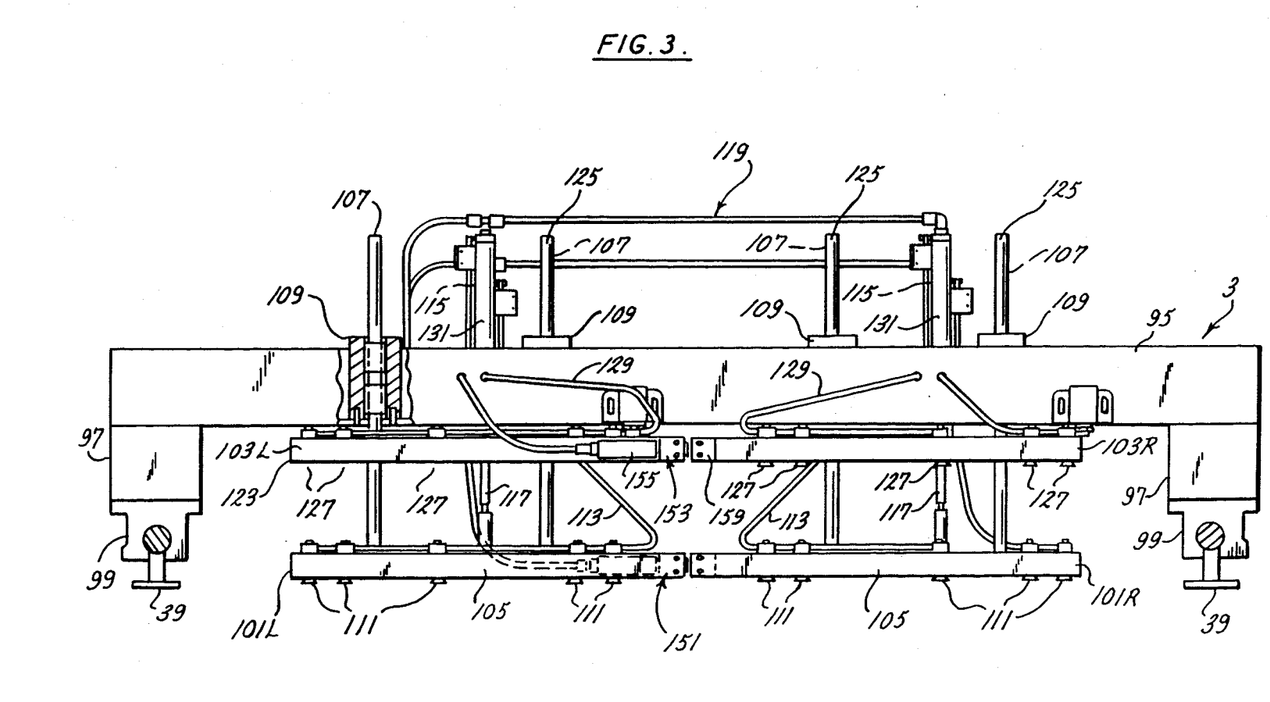
FIG. 3 is a view similar to FIG. 3 of said U.S. Pat. No. 4,423,955 showing the infeed or delivery carriage of the new apparatus in its mode for single-page plate processing.
Figure 4:
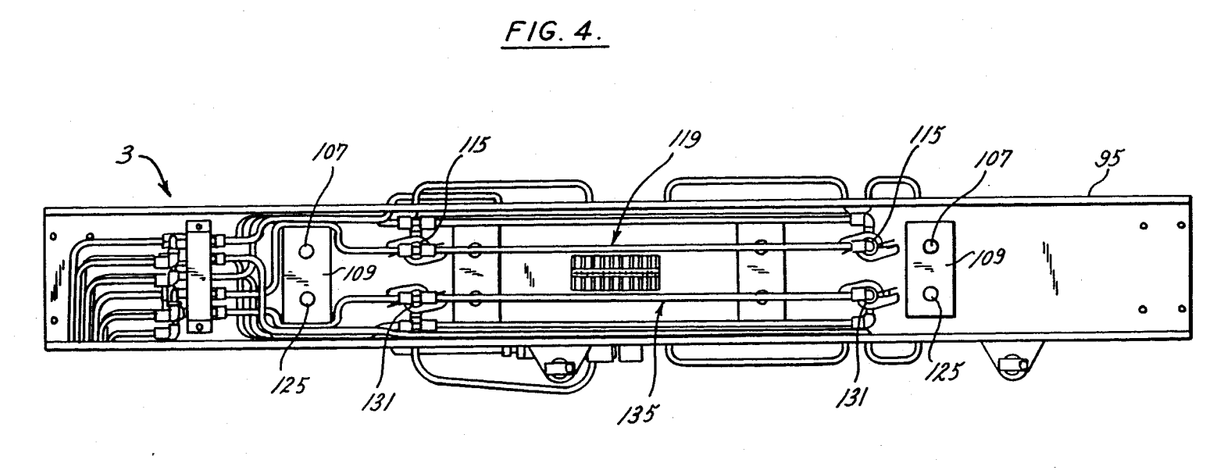
FIG. 4 is a plan of FIG. 3.

Each plate vacuum gripper means 101L and 101R comprises a plate pickup head 105 constituted by a crossbar at the lower end of a pair of rods 107 vertically slidable in bearings 109 on the carriage, and downwardly facing suction cups 111 mounted in the head at its bottom. Means for drawing vacuum in the suction cups includes flexible vacuum lines 113 (see FIG. 3) connected to the heads 105 and suitable passaging in the heads to the cups. Each plate pickup head 105 is movable downwardly from the raised retracted position in which it is illustrated in FIG. 3 by air cylinders 115 mounted on bridge member 95 of the carriage 3 having piston rods 117 extending down from its piston through a hole in the bridge member to a connection with the head. The two cylinders 115 are adapted to be supplied with air and vented for moving both the left-hand and right-hand heads 105 up and down in unison via an air system indicated generally at 119 including flexible lines allowing for the movement of the carriage 3.

Each of the film vacuum gripper means 103L and 103R comprises a film pickup 123 constituted by a head at the lower end of a pair of rods 125 vertically slidable in the bearings 109 on bridge member 95, and downwardly facing suction cups 127 mounted in the head at its bottom. Means for drawing vacuum in the suction cups includes flexible vacuum lines 129 similar to lines 113. Each film pickup head 123 is movable downwardly from the raised retracted position in which it is illustrated in FIG. 3 by air cylinders 131 mounted on the bridge member 95 having its piston rod extending down from its piston through a hole in the bridge member to a connection with the head 123. The two cylinders 131 are adapted to be supplied with air and vented for moving both the left-hand and right-hand heads 123 up and down in unison via an air system indicated generally at 135 including flexible lines allowing for the movement of the carriage.

The two plate pickup heads 105 are located in a vertical plane extending transversely with respect to the apparatus toward the forward side of the carriage and the two film pickup heads 123 are located in a vertical plane extending transversely with respect to the apparatus offset rearward from the plane of the plate pickup heads 105. The film pickup heads 105 in their raised retracted position are located at a higher elevation than the plate pickup heads (see FIG. 3), the arrangement being such that, with the heads 123 and heads 105 raised, the carriage is adapted to move rearward to its retracted plate and film pickup position wherein the film pickup heads 123 are disposed above the forward ends of the film stacks 7L and 7R in register with the film registration pins adjacent the forward ends of the film stacks, and wherein the plate pickup heads 105 are disposed above the forward ends of the plate stacks 5L and 5R in register with the plate registration pins adjacent the forward ends of the plate stacks and forward of the film stacks. The heads 105 have holes which then register with the respective pins and the heads 123 have holes which then register with the respective pins (as in U.S. Pat. No. 4,423,955).

Means is provided for moving the carriage 3 forward on the rails 39 from its plate and film pick-up position over the stacks of plates and films to the first forward or "plate registration" position in the exposure station (see U.S. Pat. No. 4,423,955) wherein the plates are adapted to be lowered and released to occupy their exposure positions, then to advance the carriage farther forward a distance (e.g., two inches) corresponding to the offset of the film stacks 7L,R from the plate stacks 5L,R to the second forward or "film registration" position in the exposure station (again see U.S. Pat. No. 4,423,955) wherein the films are adapted to be lowered and released to overlie the plates, then to return the carriage to its retracted position. In accordance with this invention, this carriage moving means comprises a ball screw mechanism generally designated 137 (see FIG. 1) comprising a ball screw 139 driven by a stepping motor 141 under control of a programmable controller 143 extending through a nut 145 carried by a bracket 147 on one of the bridge member supports 97. The controller effects microstepping operation of the motor 141 to move the carriage 3 to its required positions with relatively high accuracy and at relatively high speed without the use of mechanical stops (which may frequently need mechanical adjustment). With the ball screw mechanism driven by the motor 141 (constituting a servo motor) under control of the programmable controller 143, adjustments are effected electronically. A cover for the screw is indicated at 149.

Figure 5:
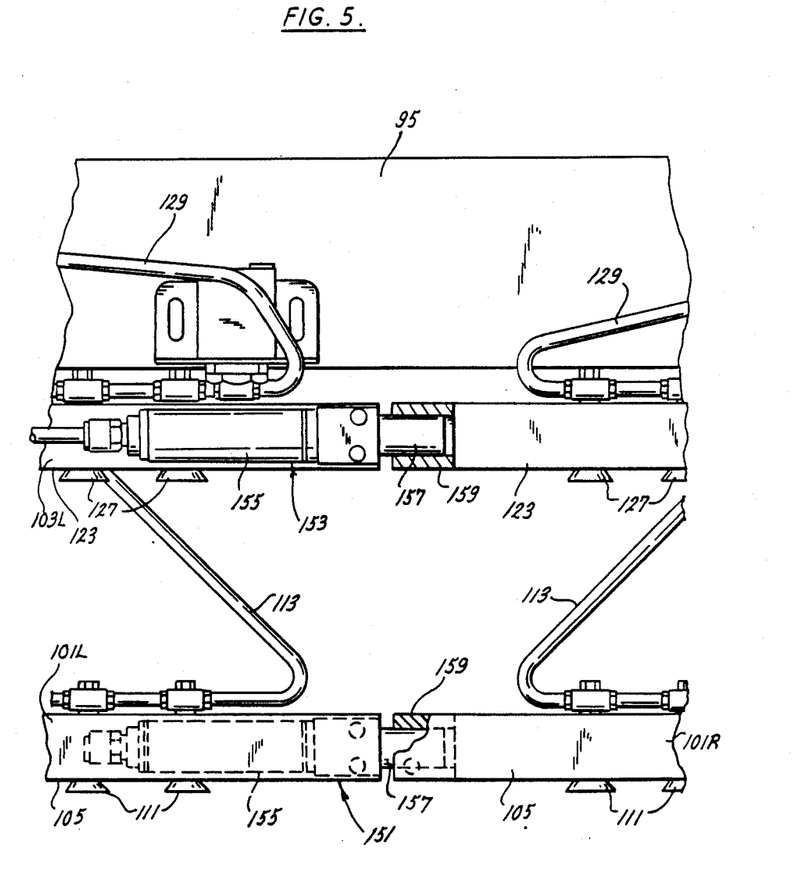
FIG. 5 is a fragment of FIG. 3 showing the carriage in its mode for double-page plate processing.

The carriage 3 is also operable in the doublepage mode of operation to deliver a double-page plate P' from the double-page stack 5' and a double-page film F' from the double-page film stack 7' to the exposure station in similar manner to the delivery of the two single-page plates and the two single-page films except that, in accordance with this invention, means 151 is provided for coupling together the left and right hand plate pickup heads 105 and means 153 is provided for coupling together the left and right hand film pickup heads 123 for smooth and even operation (see FIGS. 3 and 5). Means 151 comprises an air cylinder 155 at the inner end of one of the pickup heads 105 having a rod 157 acting as a coupling or locking pin movable on activation of the cylinder into a coupler 159 at the adjacent inner end of the other pickup head. Similarly, means 153 comprises an air cylinder 155 at the inner end of one of the pickup heads 123 having a rod 157 acting as a coupling or locking pin movable on activation of the cylinder into a coupler 159 at the adjacent inner end of the other pickup head 123.

The elevator or carriage frame 41 carries the exposure lamp means for the apparatus, this means comprising a lamp housing 161, the lamp means preferably being one including a rotary shutter for providing even exposure. Fans for blowing air for cooling the lamp means are indicated at 163.

For operation in the single-page mode, the double pane window frame or plate 57 with the two single-page size windowpanes 16L,R is secured by the T-handled pins 85 to the bottom of the elevator or carriage frame 41. Stacks 5L,R of single-page size plates P and stacks 7L,R of single page size films F are positioned for processing at 21 with the film stacks above and offset rearward from the plate stacks. With the window and lamp carriage 41 raised, the delivery carriage 3 is activated (as described in detail in said U.S. Pat. No. 4,423,955) to pick up a plate from each of the two plate stacks and a film from each of the two film stacks, to move forward to the stated "first forward" or "plate registration position " in the exposure station and lower the plates onto the platen 11 and to release them, and then to move farther forward (e.g., two inches) to the stated "second forward" or "film registration" position and to lower the films onto the plates and to release them, then to return to its retracted position. In picking up the plates and films, the left-hand pickup heads 105 and 123 in effect operate independently of the right-hand pickup heads 105 and 123 (the left-hand heads being uncoupled from the right-hand heads), thereby allowing for stack height variations. With the two plates with the films thereon on the platen 11 in the exposure station, the carriage 41 is lowered to the point where the peripheral margin of the bottom of plate 57 engages and seals against the seal 81 on the platen, thereby sealing the space between the plate 57 and the platen. Vacuum is then drawn in this space via the grooves 87 and this results in both of the single-page size windowpanes 16L and R being drawn down into pressure engagement of their bottom surfaces with the films and plates on the platen to assure flatness. This technique excludes trapping of air between each plate and the overlying film and between each film and the overlying windowpane. Then the exposure lamp is energized to expose the plates to light through the panes and the films, the carriage 41 is raised, operation proceeding in the same sequence as described in said U.S. Pat. No. 4,423,955.

Figure 6:
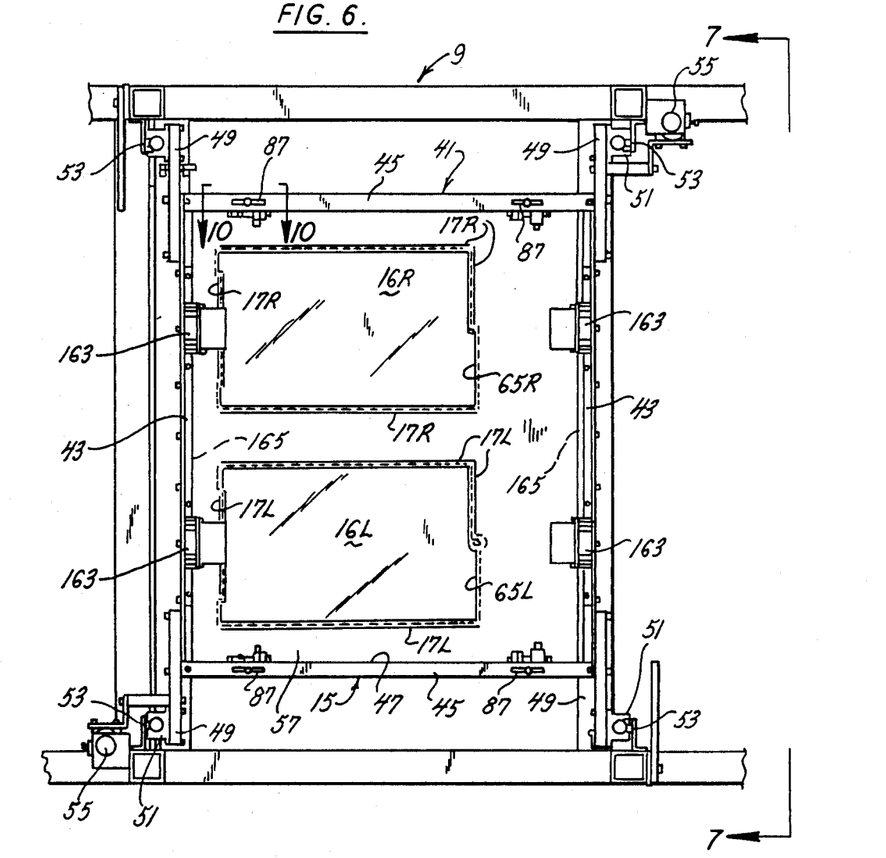
FIG. 6 is a view in plan showing window means of the apparatus and illustrating this means as used for single-page plate processing.
Figure 7:
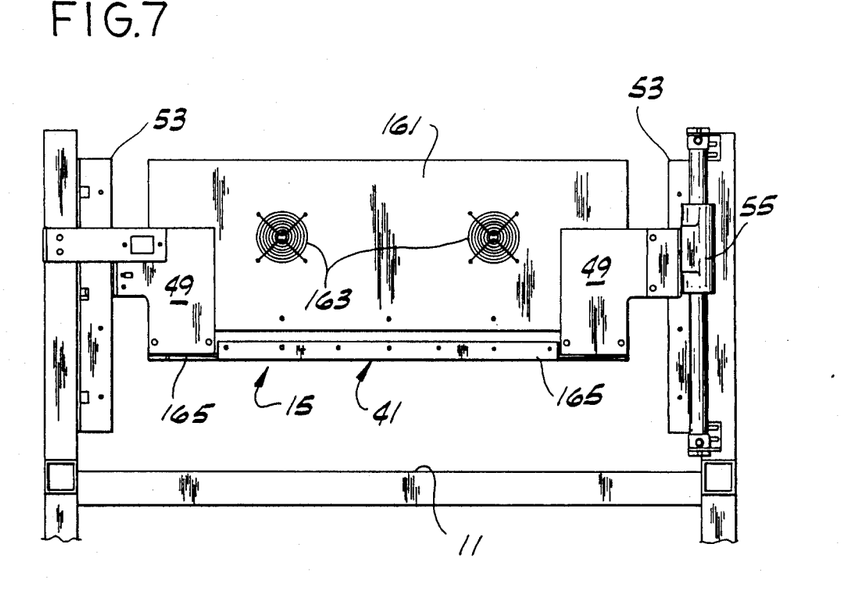
FIG. 7 is a view in elevation of FIG. 6 on line 7—7 of FIG. 6.

For operation in the double-page mode, the plate 57 with the two windows is removed by unscrewing the pins 85 from the attachment blocks 77 on the plate. Rails as indicated at 165 in FIGS. 6 and 7 are provided on the carriage 41 below the forward and rearward carriage frame members 45 to support the plate 57 when the blocks 77 are disengaged from the lower ends of the pins and to enable it to be slid out to one side or the other of the apparatus. The arrangement with the passages 93 in members 43 and the passages 95 in the blocks 77 enables disconnection of the vacuum system for the grooves 17L,R. The single pane plate 61 with the single double-page size windowpane 63 is slid onto the apparatus from one side or the other on the rails 165 and secured in position by screwing the pins 85 into the holes 79 of the blocks 77 on plate 61. Cylinders 155 are activated to throw the locking pins 157 into the couplers 159 to lock together the two plate-pickup heads 105 for conjoint operation and to lock together the two film pickup heads 123 for conjoint operation (see FIG. 5). This provides for smooth and even pickup of the double-page size plates and films. A stack 5' of double-page size plates P' and a stack 7' of double-page size films F' are positioned for processing at 21 with the film stack above and offset rearward from the plate stack. With the window and lamp carriage 41 raised, carriage 3 is activated (as described in detail in said U.S. Pat. No. 4,423,955) to pick up a plate P' from the plate stack 5' and a film F' from the film stack 7', to move forward to the stated "first forward" or "plate registration position" in the exposure station and lower the plate onto the platen 11 and to release it, and then to move farther forward (e.g., two inches) to the stated "second forward" or "film registration" position and to lower the film onto the plate and to release it, then to return to its retracted position. In picking up the plate and film, the left-hand pickup heads 105 and 123 in effect operate conjointly (the left-hand heads being coupled together with the right-hand heads), thereby allowing for smooth and even pickup of the plate and the film. With the double-page plate with the double-page film thereon on the platen 11 in the exposure station, the carriage 41 is lowered to the point where the peripheral margin of the bottom of plate 61 engages and seals against the seal 81 on the platen, thereby sealing the space between the plate 61 and the platen. Vacuum is then drawn in this space via the grooves 87 and this results in the double-page size windowpane 63 being drawn down into pressure engagement of its bottom surface with the plate and film on the platen to assure flatness. Again, this technique excludes trapping of air between the plate and the overlying film and between the film and the overlying windowpane. Then the exposure lamp is energized to expose the double-page size plate to light through the double-page size pane and the double-page size film, the carriage 41 is raised, operation again proceeding in the same sequence as described in said U.S. Pat. No. 4,423,955.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for exposing photosensitized plates to light through films operable selectively in a first mode for exposing single-page plates to light through single-page films and in a second mode for exposing double-page plates to light through double-page films, said apparatus comprising means for selectively holding side-by-side two stacks of single-page plates and two stacks of single-page films and one stack of double-page plates and one stack of double-page films with each stack of films above and offset in a rearward direction from a respective stack of plates so that each stack of plates extends forward from under the respective stack of films, an exposure station at which a single-page plate from each of the two single-page plate stacks may be simultaneously exposed to light through a single-page film from each of the single-page film stacks, or a double-page plate from the double-page stack may be exposed to light through a double-page film from the double-page film stack, with the said exposure station being located forward of the stack-holding means, means for selectively delivering a single-page plate from each of said single-page plate stacks and a single-page film from each of said single-page film stacks to exposure position at the exposure station and delivering a double-page plate from the double-page plate stack and a double-page film from the double-page film stack to exposure position at the exposure station, means at the exposure station for supporting, side-by-side, two single-page plates each with a single-page film thereon, or a double-page plate with a double-page film thereon, a carriage movable downwardly from a raised retracted position above said supporting means at the exposure station to a lowered position, said carriage having means for selectively holding a double-pane window frame having two single-page size windowpanes for operation of the apparatus in the first mode and a single-pane window frame having a double-page size windowpane for operation of the apparatus in the second mode.

2. Apparatus as set forth in claim 1 wherein said means for delivering the plates and films comprises a delivery carriage movable forward from a retracted position over the stacks to the exposure station, and rearward back to retracted position, and means for moving the delivery carriage comprising a ball screw mechanism including a ball screw, a stepping motor for driving the screw and a programmable controller controlling the motor.

3. Apparatus as set forth in claim 1 wherein said means for delivering the plates and films comprises a delivery carriage movable forward from a retracted position over the stacks to the exposure station, and rearward back to retracted position, plate gripper means and film gripper means movable up and down on the carriage, each gripper means comprising a left and right hand pickup head, the heads of each pickup means being independently operable in the first mode, and said apparatus having means for coupling together the left and right hand pickup heads of each gripper means for conjoint operation thereof in the second mode.

4. Apparatus as set forth in claim 3 wherein each coupling means comprises a locking pin at the inner end of one of the pickup heads movable from a retracted position away from the adjacent inner end of the other pickup head to an extended position in a coupler member at the inner end of the other pickup head, and an air cylinder carried by said one pickup head for actuating the pin.

5. Apparatus as set forth in claim 1 wherein the carriage comprises an open rectangular frame having forward, rearward and side members, and means associated with certain of said members for detachably securing either the double-pane or the single-pane window frame to the bottom thereof.

6. Apparatus as set forth in claim 5 wherein the double-pane window frame comprises a plate having two side-by-side single-page size window openings therein and wherein a single-page size window is mounted in each window opening.

7. Apparatus as set forth in claim 5 wherein the single-pane window frame comprises a plate having a double-page size window opening therein and wherein a double-page size window is mounted in the window opening.

8. Apparatus as set forth in claim 6 wherein the plate has a lip all around said opening at the bottom, a compressible seal on the lip, and wherein each said windowpane has a lip all around its periphery at the top bearing on the seal, the bottom face of each windowpane being above the bottom face of the plate when the respective seal is generally uncompressed, each windowpane being drawn down in the respective recess with attendant compression of the respective seal when a vacuum is drawn under the plate and the windowpane for pressure engagement of its bottom face with the plates and films at the exposure station.

9. Apparatus as set forth in claim 7 wherein the plate has a lip all around said opening at the bottom, a compressible seal on the lip, and wherein said windowpane has a lip all around its periphery at the top bearing on the seal, the bottom face of the windowpane being above the bottom face of the plate when the respective seal is generally uncompressed, the windowpane being drawn down in the respective recess with attendant compression of the seal when a vacuum is drawn under the plate and the windowpane for pressure engagement of its bottom face with the plate and film at the exposure station.

10. Apparatus for exposing photosensitized plates to light through films having an exposure station, a delivery carriage movable from a retracted position for picking up a plate from a stack thereof to bring the plate to the exposure station, and means for moving the delivery carriage comprising a ball screw mechanism including a ball screw, a stepping motor for driving the screw and a programmable controller controlling the motor.

11. Apparatus for exposing photosensitized plates to light through films operable selectively in a first mode for exposing single-page plates to light through single-page films and in a second mode for exposing double-page plates to light through double-page films, said apparatus comprising:

an exposure station at which two single-page plates may be exposed to light through two single-page films, one on each plate, or a double-page plate may be exposed to light through a double-page film thereon;

means at the exposure station for supporting, side-by-side, two single-page plates each with a single-page film thereon, or a double-page plate with a double-page film thereon, a carriage movable downwardly from a raised retracted position above said supporting means at the exposure station to a lowered position, said carriage having means for selectively holding a double-pane window frame having two single-page size windowpanes for operation of the apparatus in the first mode and a single-pane window frame having a double-page size windowpane for operation of the apparatus in the second mode.

12. Apparatus as set forth in claim 11 wherein the carriage comprises an open rectangular frame having forward, rearward and side members, and means associated with certain of said members for detachably securing either the double-pane or the single-pane window frame to the bottom thereof.

13. Apparatus as set forth in claim 12 wherein the double-pane window frame comprises a plate having two side-by-side single-page size window openings therein and wherein a single-page size window is mounted in each window opening.

14. Apparatus as set forth in claim 12 wherein the single-pane window frame comprises a plate having a double-page size window opening therein and wherein a double-page size window is mounted in the window opening.

15. Apparatus as set forth in claim 13 wherein said plate has a lip all around each opening at the bottom and a compressible seal on the lip, and wherein each windowpane has a lip all around its periphery at the top bearing on the seal, the bottom face of each windowpane being above the bottom face of the plate when the respective seal is generally uncompressed, each windowpane being drawn down in the respective recess with attendant compression of the respective seal when a vacuum is drawn under the plate and the windowpanes for pressure engagement of its bottom face with the plates and films at the exposure station.

16. Apparatus as set forth in claim 14 wherein the plate has a lip all around said opening at the bottom, a compressible seal on the lip, and wherein said windowpane has a lip all around its periphery at the top bearing on the seal, the bottom face of the windowpane being above the bottom face of the plate when the seal is generally uncompressed, the windowpane being drawn down in the respective recess with attendant compression of the seal when a vacuum is drawn under the plate and the windowpane for pressure engagement of its bottom face with the plate and film at the exposure station.

17. Apparatus for exposing photosensitized plates to light through films having an exposure station, means at the exposure station for supporting a plate with a film thereon, exposure window means movable downwardly from a raised retracted position above said supporting means at the exposure station to a lowered position, said exposure window means comprising a window frame having a window opening therein, a lip all around the opening at the bottom thereof, a compressible seal on the lip, a windowpane recessed in the opening having a lip all around its periphery bearing on the seal, the bottom face of the windowpane being above the bottom face of the plate when the seal is generally uncompressed, the windowpane being drawn down in the respective recess with attendant compression of the seal when a vacuum is drawn under the plate and the windowpane for pressure engagement of its bottom face with the plate and film at the exposure station.

* * * * *